US010985531B2

(12) United States Patent
Wang et al.

(10) Patent No.: US 10,985,531 B2
(45) Date of Patent: Apr. 20, 2021

(54) INTENSITY NOISE MITIGATION FOR VERTICAL-CAVITY SURFACE EMITTING LASERS

(71) Applicant: HEWLETT PACKARD ENTERPRISE DEVELOPMENT LP, Houston, TX (US)

(72) Inventors: Binhao Wang, Palo Alto, CA (US); Wayne Sorin, Mountain View, CA (US); Michael Renne Ty Tan, Menlo Park, CA (US); Sagi Varghese Mathai, Palo Alto, CA (US); Stanley Cheung, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 6 days.

(21) Appl. No.: 16/258,616

(22) Filed: Jan. 27, 2019

(65) Prior Publication Data
US 2020/0244040 A1    Jul. 30, 2020

(51) Int. Cl.
*H01S 5/183*    (2006.01)
*H01S 5/42*    (2006.01)

(52) U.S. Cl.
CPC ........ *H01S 5/1835* (2013.01); *H01S 5/18311* (2013.01); *H01S 5/18338* (2013.01);
(Continued)

(58) Field of Classification Search
CPC ......... H01S 5/183–18397; H01S 5/423; H01S 5/1835; H01S 5/18355;
(Continued)

(56) References Cited

U.S. PATENT DOCUMENTS 4,990,972 A * 2/1991 Satoh .................... H01L 27/153
257/627
5,331,654 A * 7/1994 Jewell ................ H01S 5/18355
372/18
(Continued)

FOREIGN PATENT DOCUMENTS

JP          04144183 A  *  5/1992
JP          11068225 A  *  3/1999
(Continued)

OTHER PUBLICATIONS

"Spectral Grids for WDM Applications: CWDM Wavelength Grid," ITU-T G.694.2, Dec. 2003. (Year: 2003).*
(Continued)

*Primary Examiner* — Joshua King
(74) *Attorney, Agent, or Firm* — Sheppard Mullin Richter & Hampton LLP

(57) ABSTRACT

A VCSEL device includes a substrate and a first DBR structure disposed on the substrate. The VCSEL device further includes a cathode contact disposed on a top surface of the first DBR structure. In addition, the VCSEL device includes a VCSEL mesa that is disposed on the top surface of the first DBR structure. The VCSEL mesa includes a quantum well, a non-circularly-shaped oxide aperture region disposed above the quantum well, and a second DBR structure disposed above the non-circularly-shaped oxide aperture region. In addition, the VCSEL mesa includes a selective polarization structure disposed above the second DBR structure and an anode contact disposed above the selective polarization structure.

19 Claims, 12 Drawing Sheets

(52) U.S. Cl.
CPC ...... *H01S 5/18341* (2013.01); *H01S 5/18355* (2013.01); *H01S 5/18388* (2013.01); *H01S 5/18394* (2013.01); *H01S 5/423* (2013.01); H01S 5/18305 (2013.01); H01S 2301/20 (2013.01)

(58) Field of Classification Search
CPC .......................... H01S 5/18311–18313; H01S 5/18386–18394; H01S 5/3202–3203; H01S 5/18338; H01S 5/18305; H01S 5/18341; H01S 2301/16; H01S 2301/20–203
See application file for complete search history.

(56) References Cited

U.S. PATENT DOCUMENTS

| | | | | |
|---|---|---|---|---|
| 5,412,680 | A * | 5/1995 | Swirhun | B82Y 20/00 372/27 |
| 5,727,014 | A * | 3/1998 | Wang | H01S 5/18355 372/108 |
| 5,778,018 | A * | 7/1998 | Yoshikawa | H01S 5/18355 372/45.01 |
| 6,002,705 | A * | 12/1999 | Thornton | H01S 5/3203 372/96 |
| 6,535,537 | B1 * | 3/2003 | Kinoshita | H01S 5/041 372/50.11 |
| 6,836,501 | B2 * | 12/2004 | Cox | H01S 5/18355 372/108 |
| 7,061,657 | B1 * | 6/2006 | Fishman | H04J 14/002 398/74 |
| 7,160,749 | B2 | 1/2007 | Chua et al. | |
| 7,352,787 | B2 | 4/2008 | Mukoyama et al. | |
| 7,978,739 | B2 * | 7/2011 | Sugawara | H01S 5/18394 372/24 |
| 8,000,374 | B2 | 8/2011 | Johnson et al. | |
| 8,355,423 | B2 | 1/2013 | Moser et al. | |
| 10,305,254 | B2 * | 5/2019 | Gazula | H01S 5/18325 |
| 2002/0110173 | A1 * | 8/2002 | di Sopra | H01S 5/423 372/46.01 |
| 2002/0172247 | A1 * | 11/2002 | Sopra | H01S 5/18355 372/46.011 |
| 2003/0039294 | A1 * | 2/2003 | Ueki | H01S 5/18394 372/96 |
| 2003/0179800 | A1 * | 9/2003 | Uebbing | H01S 5/18388 372/96 |
| 2003/0179802 | A1 * | 9/2003 | Albrecht | H01S 5/18338 372/96 |
| 2005/0083981 | A1 * | 4/2005 | Kaneko | B82Y 20/00 372/50.1 |
| 2005/0169343 | A1 * | 8/2005 | Ostermann | H01S 5/18355 372/98 |
| 2007/0014324 | A1 * | 1/2007 | Maeda | H01S 5/18391 372/46.01 |
| 2007/0115782 | A1 * | 5/2007 | Andersen | G11B 7/13 369/53.23 |
| 2007/0242715 | A1 * | 10/2007 | Gustavsson | H01S 5/18355 372/45.01 |
| 2008/0212636 | A1 * | 9/2008 | Sato | H01S 5/18311 372/50.11 |
| 2008/0240194 | A1 * | 10/2008 | Maeda | H01S 5/18355 372/50.1 |
| 2009/0180506 | A1 * | 7/2009 | Maeda | H01S 5/18394 372/44.01 |
| 2010/0177300 | A1 * | 7/2010 | Kuwata | G01S 7/491 356/39 |
| 2010/0195689 | A1 * | 8/2010 | Ariga | H01S 5/0422 372/46.01 |
| 2010/0208764 | A1 * | 8/2010 | Otoma | H01S 5/04254 372/50.1 |
| 2011/0182314 | A1 * | 7/2011 | Yoshikawa | H01S 5/18338 372/46.012 |
| 2011/0217077 | A1 * | 9/2011 | Harasaka | G03G 15/04 399/151 |
| 2011/0261139 | A1 * | 10/2011 | Hoshi | G02B 26/124 347/256 |
| 2012/0093189 | A1 * | 4/2012 | Fattal | B82Y 20/00 372/50.11 |
| 2012/0128019 | A1 * | 5/2012 | Chang-Hasnain | H01S 5/18386 372/45.01 |
| 2012/0170084 | A1 * | 7/2012 | Takeda | H01S 5/18311 358/480 |
| 2012/0294652 | A1 * | 11/2012 | Itoh | G02B 26/123 399/177 |
| 2014/0152393 | A1 * | 6/2014 | Motomura | H01S 5/18377 331/94.1 |
| 2015/0102864 | A1 * | 4/2015 | Nishida | G04F 5/145 331/94.1 |
| 2015/0288146 | A1 * | 10/2015 | Chang-Hasnain | H01S 5/021 372/50.11 |
| 2016/0164258 | A1 * | 6/2016 | Weichmann | H01S 5/18355 382/154 |
| 2017/0256915 | A1 * | 9/2017 | Ghosh | H01S 5/0421 |
| 2018/0090909 | A1 * | 3/2018 | Graham | H01S 5/2063 |
| 2019/0089127 | A1 * | 3/2019 | Gazula | H01S 5/18311 |
| 2019/0372301 | A1 * | 12/2019 | Onishi | H01S 5/04254 |

FOREIGN PATENT DOCUMENTS

| | | | | |
|---|---|---|---|---|
| WO | WO-9750109 | A2 * | 12/1997 | ........ H01S 5/18341 |
| WO | WO-2006136346 | | 12/2006 | |
| WO | WO-2014056508 | A1 * | 4/2014 | ........ H01S 5/18308 |
| WO | WO-2017171841 | A1 * | 10/2017 | ............ H04B 10/25 |

OTHER PUBLICATIONS

Fiedler, U. et al.; "High Frequency Behavior of Oxidized Single-mode Single Polarization Vcsels with Elliptical Current Aperture"; Nov. 18-21, 1996; 2 pages.

Ostermann et al., "Polarization Control of VCSELs", Annual Report 2003, University of ULM, 2003, 9 pages.

* cited by examiner

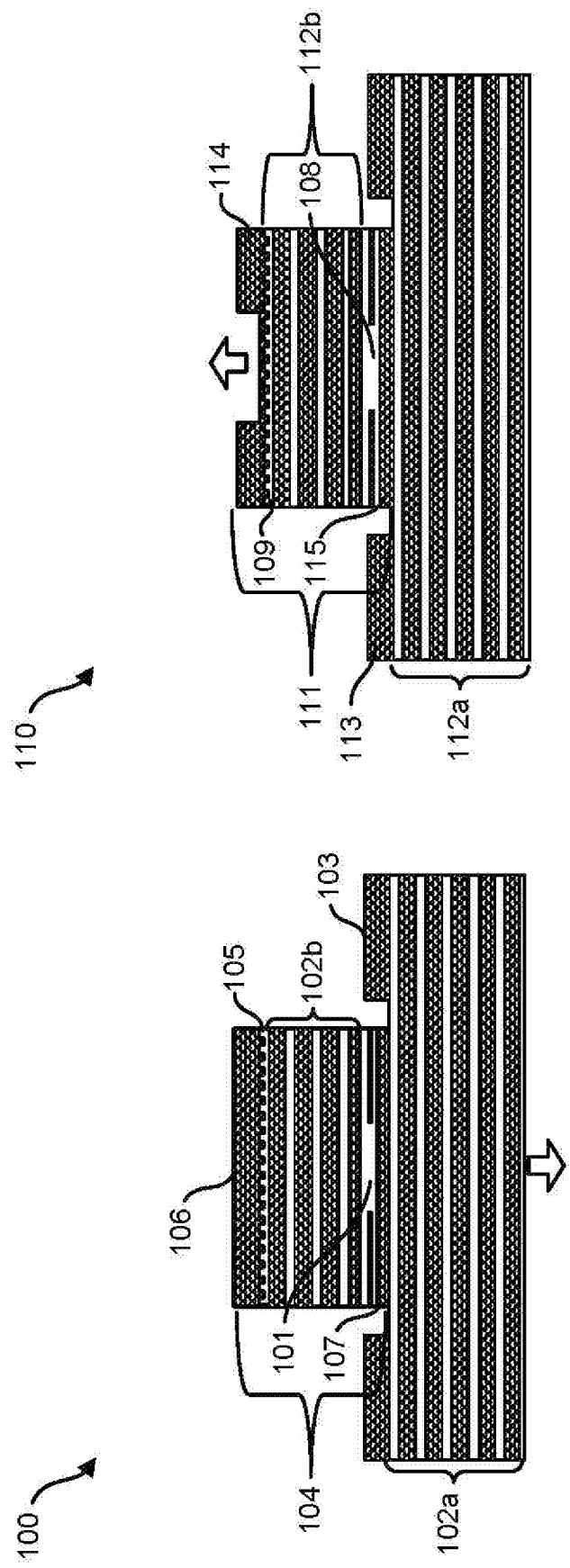

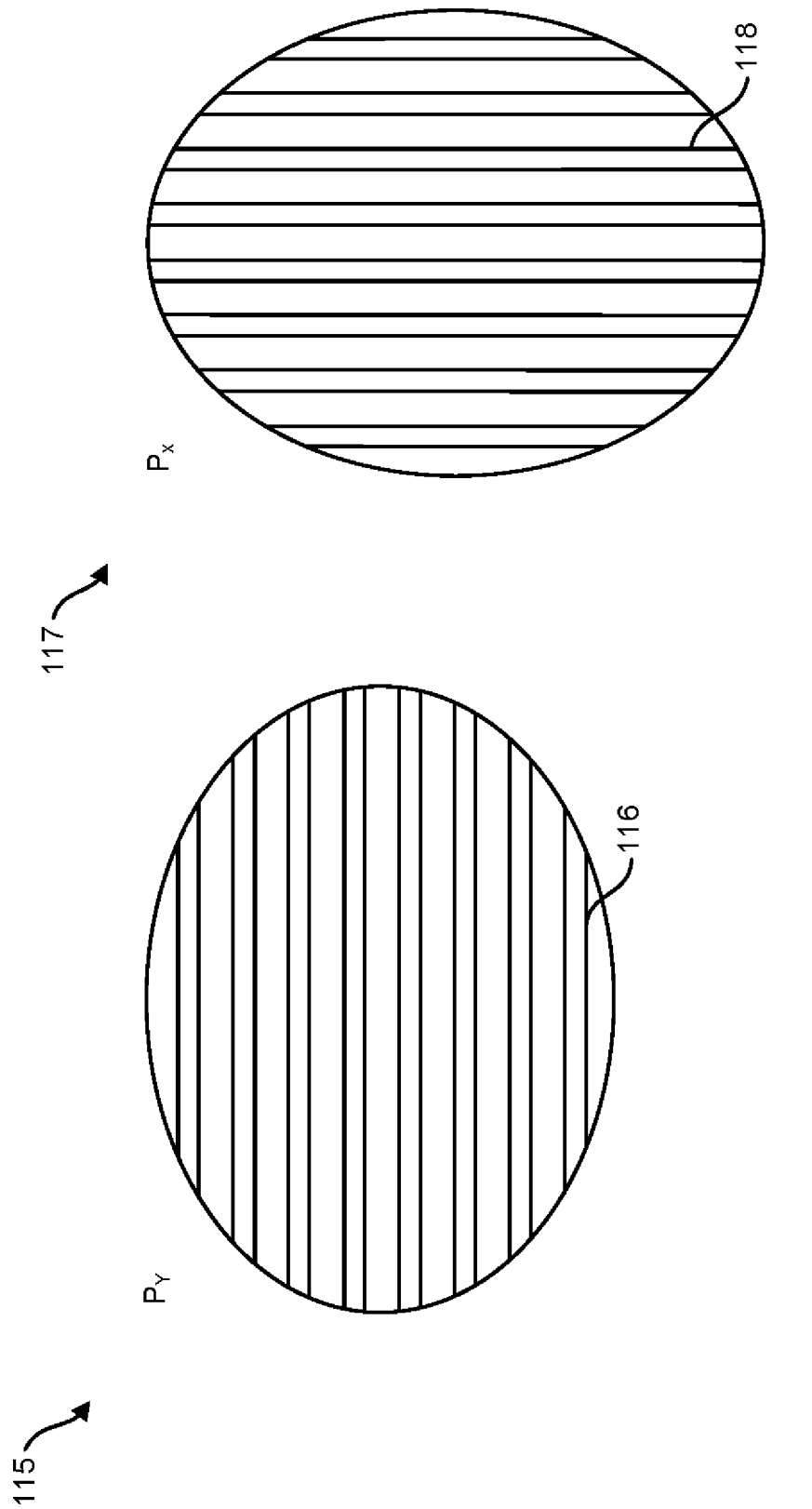

INTENSITY NOISE MITIGATION FOR VERTICAL-CAVITY SURFACE EMITTING LASERS

BACKGROUND

Advanced modulation schemes, such as four-level pulse-amplitude modulation (PAM-4), have been investigated due to the steady demand for low-power, high-bandwidth optical interconnections for high-performance computers (HPC) and data centers. In addition, vertical-cavity-surface-emitting-lasers (VCSELs) are being employed in PAM-4 optical transceivers. Efforts to improve the signal-to-noise ratio associated with VCSEL devices have been directed to reducing the optical noise attributed to intrinsic noise, mode competition noise, and mode beating noise.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIG. 1 is a cross-sectional view of a bottom-emitting VCSEL device, according to one or more implementations of the present disclosure.

FIG. 2 is a cross-sectional view of a top-emitting VCSEL device, according to one or more implementations of the present disclosure.

FIG. 5 is a top view of two orthogonal gratings implemented to reduce noise attributed to complementary polarization light modes, according to one or more implementations of the present disclosure.

DETAILED DESCRIPTION

Figure 3:
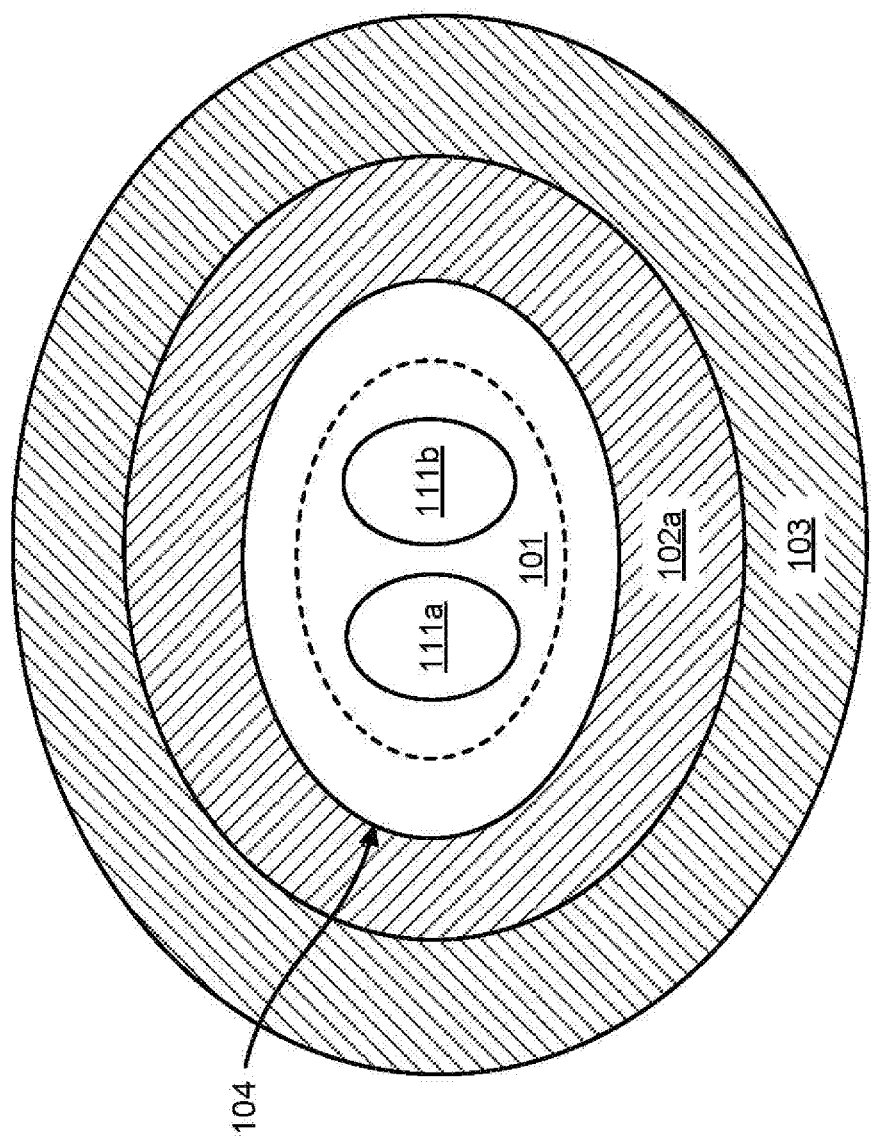
FIG. 3 is a top view of a portion of a VCSEL mesa of the bottom-emitting VCSEL device shown in FIG. 1, according to one or more implementations of the present disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

A VCSEL device is a semiconductor laser which has an optical cavity that is oriented perpendicularly to the semiconductor substrate. VCSEL devices can emit light (e.g., laser beams) from a top or bottom surface, enabling simple wafer-level testing. VCSEL devices can modulate at frequencies greater than 50-100 Gbps and are useful for high-speed communications and precision sensing applications. Top-emitting VCSEL devices, in particular, are often used to generate light having wavelengths that are between 850 nm and 940 nm. For example, 850 nm, 880 nm, 910 nm, and 940 nm wavelengths of light may be used by top-emitting CWDM systems to transmit four-color coarse wavelength division multiplexing (CWDM) signals. Moreover, bottom-emitting VCSEL devices can be employed to emanate light having wavelengths that are between 990 nm and 1065 nm. For example, 990 nm, 1015 nm, 1040 nm, and 1065 nm wavelengths of light may be used to transmit optical signals by bottom-emitting CWDM systems.

Efforts to improve signal-to-noise ratio of VCSEL devices include decreasing the optical noise associated with these devices. Optical noise may be expressed as a relative intensity noise (RIN) which may include intrinsic noise, mode competition noise, mode beating noise, etc. Mode beating noise, in particular, commonly occurs in VCSEL devices.

Mode beating noise is defined herein as a phenomenon in optoelectronics which occurs when the frequency difference between any two light modes falls within the electrical bandwidth of a receiver device. Mode beating noise is often associated with a range of mode beating frequencies. Mode beating noise generally includes spatial-mode beating noise and/or polarization mode beating noise. Spatial light modes with different frequencies can cause spatial-mode beating noise within the electrical bandwidth of a receiver device. Furthermore, polarization light modes with slightly different frequencies can cause polarization mode beating noise within an electrical bandwidth of a receiver device. For instance, mode beating noise can occur when two laser signals with different optical frequencies superimposed on a receiver device (e.g., a photodetector) thereby causing variations in current. In many instances, mode beating can cause optical noise associated with the emitted light which manifests as electrical noise at a receiver side.

The present disclosure provides several examples of a VCSEL device which incorporates a non-circularly-shaped oxide aperture region with various orientations. In some implementations, VCSEL devices disclosed herein have non-circularly-shaped oxide aperture regions that are asymmetrically-shaped. Incorporating a non-circularly-shaped oxide aperture region may increase the frequency spacing between adjacent spatial optical modes such that the beat frequencies associated with mode beating are larger than the bandwidth of a receiver device thus decreasing the spatial and polarization mode beating noise relative to conventional VCSEL devices with circularly or symmetrically-shaped oxide aperture regions. Furthermore, the VCSEL devices described herein may incorporate a selective polarization structure that reduces polarization mode beating noise. In some implementations, the selective polarization structure significantly reduces polarization mode beating noise by effectively allowing only a single state of polarization to lase (e.g., lock polarization of the spatial modes).

The VCSEL device provided by the present disclosure employs a selective polarization structure which maximizes a first polarization of light to resonate in the oxide aperture region and be emitted from the VCSEL device and minimizes a second polarization of light which is orthogonal to the first polarization of light from resonating in the oxide aperture region and being emitted therefrom. In yet other implementations, the selective polarization structure may be contained within the VCSEL device on top of a DBR mirror that introduces loss for the undesired polarized light thereby significantly reducing this type of light polarization.

Herein, light polarization is defined as a confinement of an electric field vector or magnetic field vector to a given plane perpendicular to the direction of light propagation. For example, if an electric field is substantially vertical, the radiation is substantially vertically polarized whereas if the electric field is substantially horizontal, the radiation is substantially horizontally polarized.

A VCSEL device may be incorporated within an opto-electronic VCSEL-based transmission system (herein referred to as a VCSEL transmission system). Such VCSEL transmission systems can include, but are not limited to, an optical transceiver or other optical module. In some implementations, a VCSEL transmission system includes a transmitter which includes a plurality of VCSEL terminals having non-circularly-shaped oxide aperture regions with various orientations and selective polarization structures to reduce VCSEL noise. In some implementations, each of the VCSEL terminals include a substrate (e.g., gallium arsenide), a first DBR structure disposed on the substrate, a cathode contact disposed on a top surface of the first DBR structure, a VCSEL mesa composed of a gain media (e.g., multiple quantum wells and quantum dots), oxide aperture region and second DBR disposed on the top surface of the first DBR structure and spaced apart from the cathode contact, and an anode contact disposed on the top surface of the VCSEL mesa. In other implementations, when positions of the cathode contact and an anode contact are flipped or switched, each of the VCSEL terminals can include a substrate, a first DBR structure disposed on the substrate, the anode contact disposed on a top surface of the first DBR structure, and a VCSEL mesa disposed on the top surface of the first DBR structure and spaced apart from the anode contact, and cathode contact disposed on the top surface of the VCSEL mesa.

Herein, a VCSEL mesa is defined as a protrusion in a vertical direction from a gain layer stack surface, mirror, or substrate. Fabricating the VCSEL mesas may include epitaxially growing a series of semiconductor layers upon a substrate (e.g., GaAs substrate) and etching the semiconductor layers to form the VCSEL mesas. In some implementations, a peripheral region of the VCSEL mesa structure is oxidized to define an oxide aperture region that is typically surrounded by a high-resistance oxide region. Notably, the VCSEL mesa is fabricated such that it has a non-circular or non-symmetric horizontal profile. In some implementations, the oxide aperture region conforms to the non-circular or asymmetric profile of the fabricated VCSEL mesa.

The VCSEL mesa may include a quantum well, an oxide aperture region having any shape other than circular (e.g., non-circularly-shaped or asymmetrically shaped oxide aperture region) disposed below or above the quantum well (e.g., or partially above and partially below the quantum well), a second DBR structure disposed above the non-circularly-shaped oxide aperture region, a selective polarization structure disposed above the second DBR structure, and an anode or cathode contact disposed above the selective polarization structure. Notably, the present disclosure provides a VCSEL device which employs a non-circularly-shaped oxide aperture region within each VCSEL mesa which increases the mode frequency separation between light modes within one or more mode groups to reduce the relative intensity noise at a receiver end within the receiver bandwidth.

The present disclosure provides a relatively inexpensive and scalable low-noise VCSEL transmission system which may implement mode-division multiplexing (MDM), coarse wavelength division multiplexing (CWDM), dense wavelength division multiplexing (DWDM), polarization multiplexing, and/or symbol multiplexing (e.g., PAM4)). The VCSEL transmission system described herein includes VCSELs, optical lenses, optical fibers, photodetectors, optical connectors, multiplexers, and/or demultiplexers. However, the present disclosure is not limited thereto. A VCSEL transmission system may also incorporate dielectric high-contrast (sub-wavelength) grating structures which can collimate (e.g., focus) and change the mode of light emitted by the VCSEL devices. The grating structures can be used to combine or split emitted light within the VCSEL transmission system as well.

In some implementations, a VCSEL transmission system may include a four, eight, twelve, or sixteen-fiber ribbon array for increased bandwidth for high-performance computers and mega-data centers.

Turning now to the drawings, FIG. 1 is a cross-sectional view of a bottom-emitting VCSEL device 100, according to one or more implementations of the present disclosure. Bottom-emitting VCSEL device 100 can incorporate a non-circularly-shaped oxide aperture region 101 with any of numerous non-circularly-shaped ellipticities and orientations with respect to the substrate crystal axes. Bottom-emitting VCSEL device 100 includes a VCSEL mesa 104 and a cathode contact 103 disposed on a first DBR mirror 102a (e.g., an n-doped DBR (n-DBR)) which is disposed on a substrate (not shown). The VCSEL mesa 104 includes a quantum well structure(s) 107 disposed on the top surface of the first DBR mirror 102a. Further, adjacent to (e.g., above) the quantum well structure(s) 107 is an oxide or aperture confinement layer including the non-circularly shaped oxide aperture region 101 (e.g., elliptically-shaped oxide aperture region). In some implementations, the quantum well structure 107 is disposed above the oxide or aperture confinement layer. As will be explained in more detail below, the non-circularly-shaped oxide aperture region 101 may have an elliptically-shaped oxide aperture region to help reduce noise attributed to mode beating (e.g., spatial and polarization-mode beating noise). It should be understood by those having ordinary skill in the art that reference to a non-circularly-shaped oxide aperture region 101 herein may refer to an oxide aperture region, such as an elliptically-shaped oxide aperture region, which has an aspect ratio that is greater than or equal to 1.05 with respect to its major and minor axis dimensions. In other implementations, the aspect ratio is less than or equal to 2.0 (e.g., such that the aspect ratio may range between 1.05 and 2.0, 1.1 to 2.0, 1.1 to 1.4) as described in more detail below.

The VCSEL mesa 104 further includes a second DBR mirror 102b (e.g., a p-doped DBR (p-DBR)) which is disposed above the quantum well structure 107 and the non-circularly-shaped oxide aperture region 101. In addition, the second DBR mirror 102b is disposed below a selective polarization structure 105. Notably, the selective polarization structure 105 includes a grating structure. As will be explained in more detail below, the selective polarization structure 105 can lock the polarization of spatial modes in a VCSEL device, such as the bottom-emitting VCSEL device 100, to reduce noise. Additionally, an anode contact 106 is disposed above the selective polarization structure 105. In some implementations, the positions of the anode contact 106 and the cathode contact 103 (and the corresponding DBR mirrors 102a and 102b) are switched. In other words, the cathode contact 103 is disposed above the selective polarization structure 105 with the first DBR mirror 102a underneath and the anode contact 106 is disposed on the top surface of the second DBR mirror 102b disposed on the substrate (not shown). Additionally, the selective polarization structure may extend over the entire second DBR 102b or only over a partial area over the second DBR 102b.

FIG. 2 is a cross-sectional view of a top-emitting VCSEL device 110, according to one or more implementations of the present disclosure. The top-emitting VCSEL device 110 can also incorporate a non-circularly-shaped oxide aperture region 108 with any of the numerous non-circularly-shaped ellipticities and orientations as described herein. The top-emitting VCSEL device 110 may include any of the components as described above with respect to the bottom-emitting VCSEL device 100. For example, top-emitting VCSEL device 110 may include a VCSEL mesa 111 and a cathode contact 113 disposed on the top surface of the first DBR mirror 112a. The VCSEL mesa 111 includes a quantum well structure 115 disposed on the top surface of the first DBR mirror 112a. The VCSEL mesa 111 further includes a second DBR mirror 112b which is disposed above the quantum well structure 115. Furthermore, the top-emitting VCSEL device 110 can also employ a selective polarization structure 109 to lock the polarization of spatial modes in the top-emitting VCSEL device 110 to reduce noise. Additionally, an anode contact 114 is disposed above the selective polarization structure 109 substantially covering the perimeter of the mesa top surface.

FIG. 3 is a top view of a portion of the VCSEL mesa 104 of the bottom-emitting VCSEL device 100 shown in FIG. 1, according to one or more implementations of the present disclosure. As shown, the VCSEL mesa 104 is elliptically-shaped which influences the shape of the elliptically-shaped oxide aperture region 101. In some implementations, example diameter dimensions of oxide aperture region 101 and VCSEL mesa 104 is approximately seven micrometers and twenty-one micrometers, respectively. Notably, the top view of the VCSEL mesa 104 shows the first DBR mirror 102a and the cathode contact 103. The cathode contact 103 is spaced apart from the VCSEL mesa 104 by a gap or space (e.g., a top surface of first DBR mirror 102a extending therebetween and along bottom surfaces thereof). In some implementations, cathode contact 103 may be replaced by an anode contact 106 as described above. In such implementations, the anode contact 106 is spaced part from the VCSEL mesa 104 by a gap or space (e.g., a top surface of first DBR mirror 102a extending therebetween). In addition, the VCSEL mesa 104 is shown to emit a two-peak (e.g., dumb-bell profile) mode light 111a, 111b.

Figure 4A:
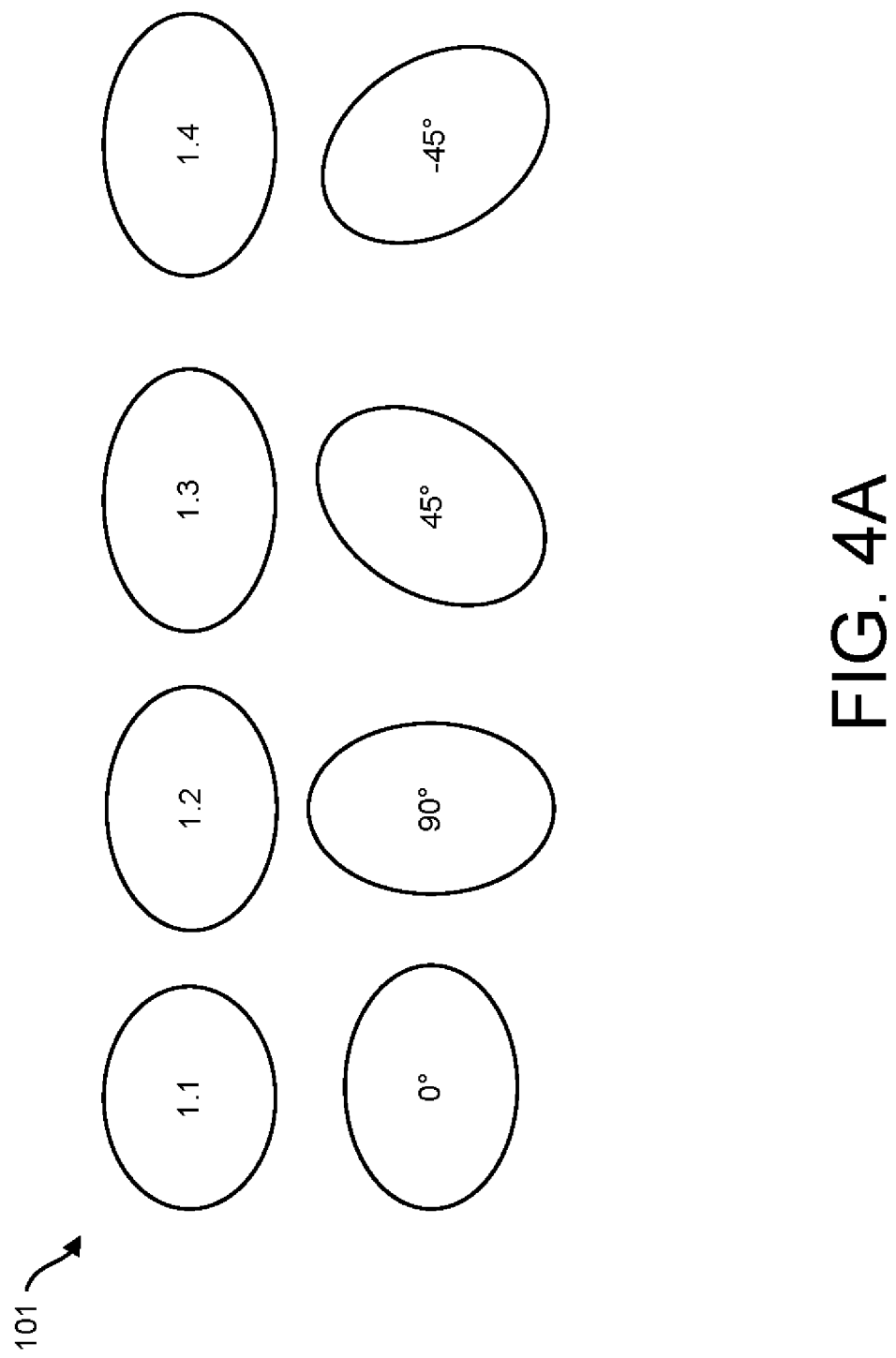
FIG. 4A depicts example elliptically-shaped oxide aperture regions with various ellipticities and orientations, according to one or more implementations of the present disclosure.

FIG. 4A depicts example elliptically-shaped oxide aperture regions 101 with various example ellipticities and orientations, according to one or more implementations of the present disclosure. Notably, the example shapes and orientations of the oxide aperture regions 101 are not limited to those shown in FIG. 4A. As such, the oxide aperture regions may have any non-circular shape such as, but not limited to, an elliptical shape, rectangular shape (e.g., with rounded or "chopped-off" corners), rounded rectangular shape, cushion-cut shape, oval shape, stadium shape, octagon shape, hexagon shape, etc. In one implementation, the oxide aperture region has a circularly-shaped oxide aperture region, however, with one or both "chopped-off" opposing corners.

The example ellipticities include elliptically-shaped oxide aperture regions having aspect ratios of 1.1, 1.2, 1.3, and 1.4. However, the present disclosure is not limited thereto. In some implementations, suitable aspect ratios for the elliptically-shaped oxide aperture regions may be greater than or equal to 1.05 but less than or equal to 2.0. Furthermore, the example orientations may include, but are not limited to, zero degrees (0°), ninety degrees (90°), forty-five degrees (45°), and negative 45 degrees (−45°), all relative to a major crystal plane.

Figure 4B:
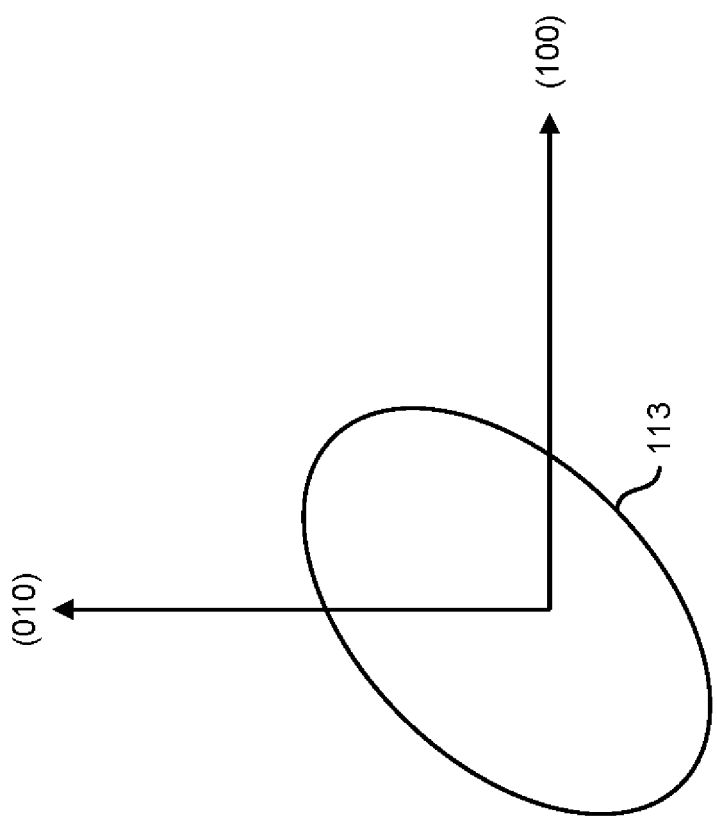
FIG. 4B depicts an elliptically-shaped oxide aperture region relative to an example crystal plane disposed on a crystal structure.

FIG. 4B depicts an elliptically-shaped oxide aperture region 113 relative to example crystal planes (100) and (010). As shown, elliptically-shaped oxide aperture region 113 is oriented 45° relative to major crystal planes (100) and (010). However, one having ordinary skill in the art may appreciate that the present disclosure is not limited thereto. In addition, the size of the elliptically-shaped oxide aperture region 113 is not necessarily to scale.

FIG. 5 is a top view of example selective polarization structures 115, 117 implemented to reduce noise attributed to complementary polarization light modes, according to one or more implementations of the present disclosure. In one or more implementations described herein, the complementary polarized light mode is a light mode that is orthogonal to a light mode of interest. For example, the bottom-emitting VCSEL device 100 shown in FIG. 1 (e.g., polarization structure 105) may employ the selective polarization structure 115 to maximize the emission of light which has a y-polarized orientation 116 and to minimize the emission of light which has an x-polarized orientation 118. In some implementations, maximizing the emission of light for a particular light polarization includes maximizing a reflection of the light polarization within the VCSEL mesa 104 of the bottom-emitting VCSEL device 100. Alternatively, the top-emitting VCSEL device 110 (e.g., polarization structure 109) may employ the selective polarization structure 117 to maximize the emission of light which has an x-polarized orientation 118 but effectively minimizes the emission of light which has a y-polarized orientation 116. In some implementations, the selective polarization structures 115, 117 are orthogonal to each other.

In some implementations, each of the bottom and top-emitting VCSEL devices 100, 110 maximizes the emission of a first polarized light by enabling the reflectance of the first polarized light within the bottom and top-emitting VCSEL device 100, 110. Alternatively, in other implementations, each of the bottom and top-emitting VCSEL devices 100, 110 minimizes the emission of a second polarized light which is complementary (e.g., orthogonal) to the first polarized light by suppressing the reflection of the second polarized light within the bottom and top-emitting VCSEL devices 100, 110.

Accordingly, selective polarization structures 115, 117 may be constructed such that they maximize certain light polarizations while minimizing other light polarizations which are complementary (e.g., orthogonal) thereto. Moreover, in some implementations, the selective polarization structures 115, 117 may be tailored for specific types of VCSEL devices 100, 110.

It should be understood by those having ordinary skill in the art that a VCSEL device may be pre-disposed or have an affinity to emit light with a particular polarization. As such, if for example, the bottom-emitting VCSEL device 100 is fabricated such that it has an affinity to lase light with a certain polarization (e.g., y-polarized light), the selective polarization structure 115 may be employed to maximize the lasing of this polarization of light while minimizing the lasing of light that has a polarization that is orthogonal thereto (e.g., x-polarized light).

Although the implementation shown in FIG. 5 depicts selective polarization gratings 115, 117 which only minimizes the lasing of a single light polarization, the present disclosure is not limited thereto. The present disclosure is further amenable to include selective polarization gratings which minimizes one or more light modes which may or not be orthogonal to a selected light mode of interest.

Figure 6:
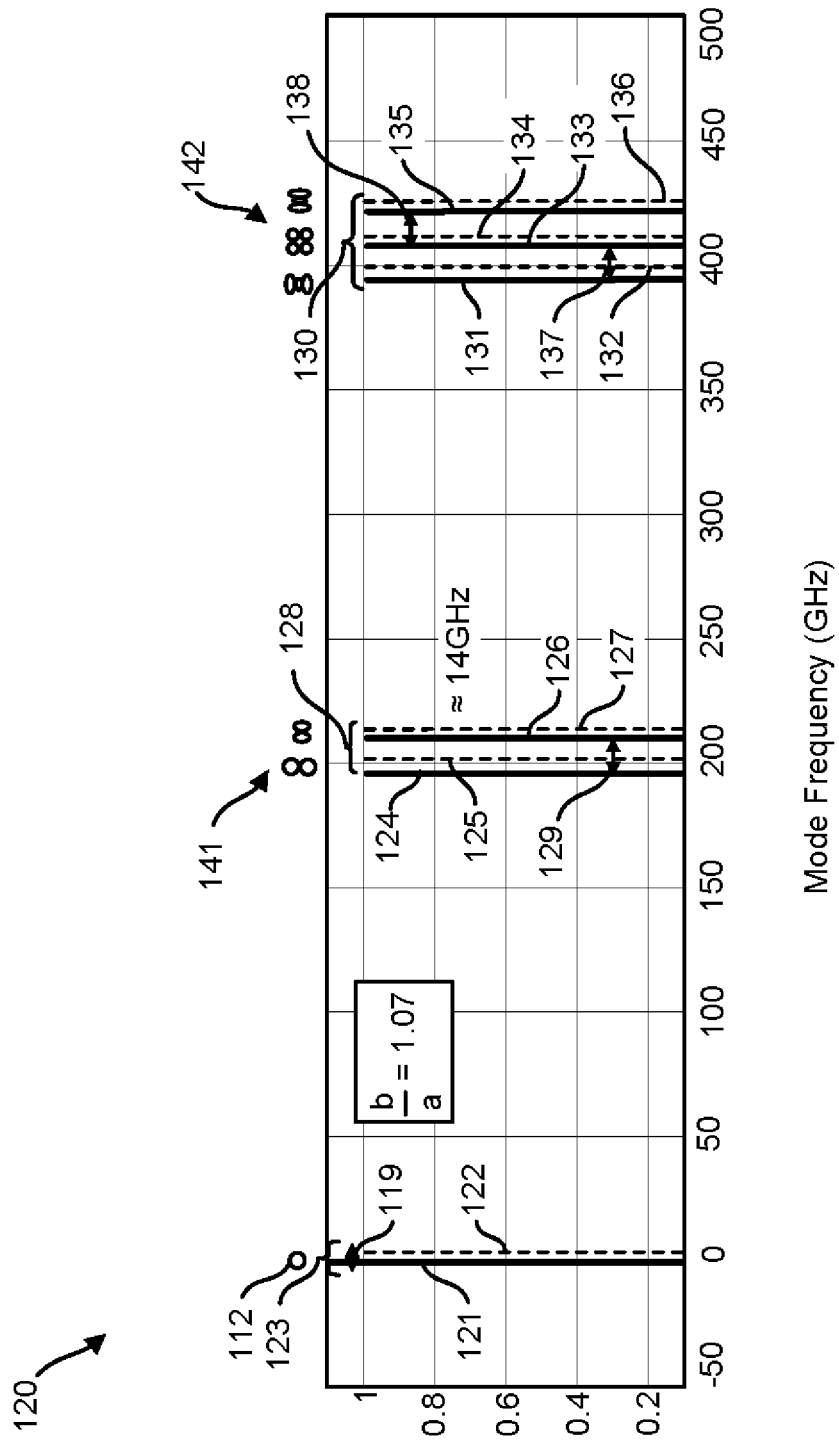
FIG. 6 is a mode frequency graph depicting an optical spectrum of a VCSEL device which has an oxide aperture region with an ellipticity of 1.07, according to one or more implementations of the present disclosure.

FIG. 6 is a mode frequency graph 120 depicting an optical spectrum of a VCSEL device which has an oxide aperture region with an ellipticity of about 1.07. The optical spectrum depicted by the mode frequency graph 120 illustrates three mode groups of light 123, 128, 130. As known by those having ordinary skill in the art, each light mode group 123, 128, 130 has one or more modes of light along with a complementary (e.g., orthogonal) polarization light mode.

As shown, the mode group 123 includes a light mode 121 and a complementary polarized light mode 122. In the implementation shown, the light mode 121 is emitted at 0 GHz relative to an optical frequency of about 300 terahertz (THz) and its complementary polarized light mode is emitted at about 2 GHz. In some implementations, the light modes 121, 122 are zero-order Laguerre Gaussian modes of light. Although the frequency separation 119 between light mode 121 and its complementary polarized light mode 122 is about 2 GHz, the frequency separation 119 may be between 0 to 15 GHz, or 15 to 20 GHz.

In some implementations, the light modes within each mode group may have a characteristic mode profile 112 as a light signal propagates along an optical path. In one implementation, the light modes 121, 122 may be referred to as $M1A_X$, $M1A_Y$, respectively, which identifies the mode group (e.g., mode group 1), the light mode within a respective mode group (e.g., light mode A), and the light's polarization (e.g., x-polarized or y-polarized).

In some implementations, the light modes 121, 122 are orthogonal to each other with respect to their light polarizations. It should be understood by those having ordinary skill in the art that each light mode within a particular mode group is not limited to a single complementary (e.g., orthogonal) light mode. For example, there may be several complementary polarizations within each beam of emitted light.

Mode group 128 includes light modes 124, 126 and complementary polarized light modes 125, 127, respectively. Light modes 124, 125 may have a characteristic mode profile as depicted by one of the mode profiles of the mode profile set 141 whereas light modes 126, 127 may have a different mode profile of the mode profile set 141 relative to light modes 124, 125 (e.g., emitted at about 190-200 GHz relative to an optical frequency of about 300 THz).

The light modes 124-127 may be referred to as M2Ax, M2Ay, M2Bx and M2By, respectively, which identifies the mode group, light mode within the mode group, and the light polarization as previously discussed. Notably, a mode frequency separation 129 between the light mode 124 and the light mode 126 is about 14 GHz. In some implementations, the light mode pairs 124, 125 and 126, 127, respectively, are orthogonal with respect to each other as light modes 125, 127 are complementary polarizations of light modes 124, 126, respectively. In one or more implementations, light mode 124 is x-polarized and its complementary light mode 125 is y-polarized.

Alternatively, light mode 126 may be polarized about a particular angle (e.g., 45°) whereas its complementary light mode 127 may be polarized about a different angle (e.g., 135°) which may or may not be orthogonal thereto. The present disclosure may be employed to implement selective polarization gratings to minimize the lasing of complementary light modes which may (or may not) be orthogonal to light modes which are selected to be maximized. Moreover, it should be understood by those having ordinary skill in the art that the present disclosure in the art that the present disclosure is not limited to minimizing the lasing of light modes with a single complementary light mode. Accordingly, the present disclosure may employ a selective polarization grating which may minimize the lasing of one or more light modes.

Next, mode group 130 includes light modes 131, 133, 135 and complementary polarized light modes 132, 134, 136, respectively. The light modes 131-136 may be referred to as M3Ax, M3Ay, M3Bx, M3By, M3Cx and M3Cy, respectively. As shown, the light modes 131-136 are emitted between about 380 GHz and about 420 GHz. Light modes 131, 132 may have a characteristic mode profile as depicted by one of the mode profiles of the mode profile set 142 whereas light modes 133, 134 may have a different mode profile of the mode profile set 142. Likewise, light modes 135, 136 may have a different mode profile of the mode profile set 142 (e.g., such that all the light mode pairs have different mode profiles relative to each other).

In some implementations, light mode pairs 131/132, 133/134, and 135/136 within mode group 130 are orthogonal with respect to their polarizations. The mode frequency separations 137, 138 are shown to be equal to or less than 20 GHz (e.g., about 14 GHz). As such, a receiver device (e.g., photodetectors) with a detection bandwidth of about 20 GHz may experience noise when optical modes are spaced by less than 20 GHz. In other words, when optical signals are too close together such that the beating frequency falls within the receiver bandwidth, increased mode-beating noise is generated.

It should be understood by those having ordinary skill in the art that although the optical spectrum depicted in the mode frequency graph 120 displays three mode groups of light 123, 128, 130, the present disclosure is not limited thereto. The optical spectrum of light emitted from a VCSEL device may include greater than or less than the three mode groups of light 123, 128, 130 as depicted in FIG. 6, according to some implementations. For example, an optical spectrum of light emitted from a VCSEL device may have up to five mode groups although only three of the mode groups 123, 128, 130 are shown in FIG. 6.

As discussed, the light modes within each mode group 123, 128, 130 are relatively close in frequency (e.g., 14 GHz) with respect to mode frequency separation. For instance, within mode group 128, the mode frequency separation 129 between light modes 124, 126 may be less than or fall within the bandwidth (e.g., 20 GHz) of a receiver device which may lead to mode beating noise.

In another example, the mode frequency separation 137 (e.g., 14 GHz) between light modes 131, 133 within mode group 130 is close to or less than (e.g., falls within) the detection bandwidth (e.g., 20 GHz) of a receiver device and likewise the mode frequency separation 138 (e.g., 14 GHz) between the light modes 133, 135 is close to or less than (e.g., falls within) the detection bandwidth (e.g., 20 GHz) of a receiver device.

Figure 7A:
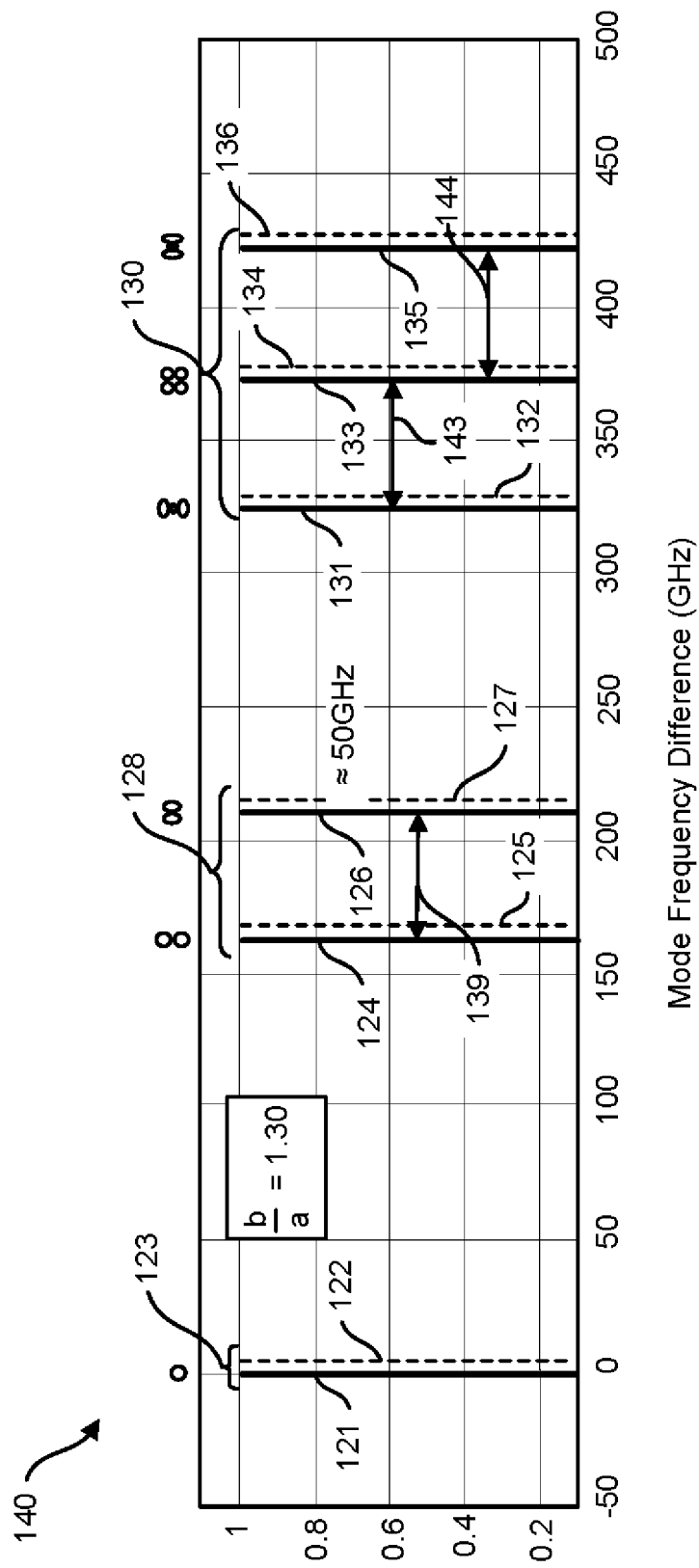
FIG. 7A is a mode frequency graph depicting an optical spectrum of a VCSEL device which has an oxide aperture region with an ellipticity of 1.30, according to one or more implementations of the present disclosure.

In some implementations, to decrease the noise (e.g., RIN) on a receiver side of light emitted from the VCSEL devices, the aspect ratio of the elliptically-shaped oxide aperture region may be increased to increase the mode frequency separation between the light modes within each of the mode groups as illustrated in FIG. 7A.

FIG. 7A is a mode frequency graph 140 depicting an optical spectrum of a VCSEL device (e.g., bottom or top-emitting VCSEL devices 100, 110) that has an oxide aperture region with an ellipticity of about 1.30, according to one or more implementations of the present disclosure. Notably, the optical spectrum illustrates the three mode groups 123, 128, 130 previously illustrated in FIG. 6. However, each of the light modes within the mode groups 123, 128, 130 are noticeably further apart (e.g., about 40-50 GHz) with respect to their mode frequency separations. In one or more implementations of the present disclosure, the increase in mode frequency separation may be the result of degenerate splitting.

Degenerate splitting may be defined herein as a process of configuring an internal structure of a VCSEL device to increase the mode frequency separation of light modes within one or more mode groups. In some implementations, degenerate splitting can be employed to increase the mode frequency separation between light modes within each light mode group to be greater than the detection bandwidth of a receiver device. For example, for a 20 GHz receiver bandwidth, degenerate splitting may be employed such that a VCSEL device (e.g., bottom and top-emitting VCSEL devices 100, 110) emits light with light modes that have a mode frequency separation of at least 40 GHz for each mode group.

As such, the increase in mode frequency separation of the light modes within each mode group of light 123, 128, 130 can reduce spatial-mode beating noise as the mode frequency separations 139, 143, 144 may be greater than a receiver's bandwidth. For example, if the frequency bandwidth of a receiver device (not shown) is about 20 GHz, a mode frequency separation of about 50 GHz would be outside of the receiver's bandwidth and may therefore not subject to the deleterious effects of spatial-mode beating noise.

Figure 7B:
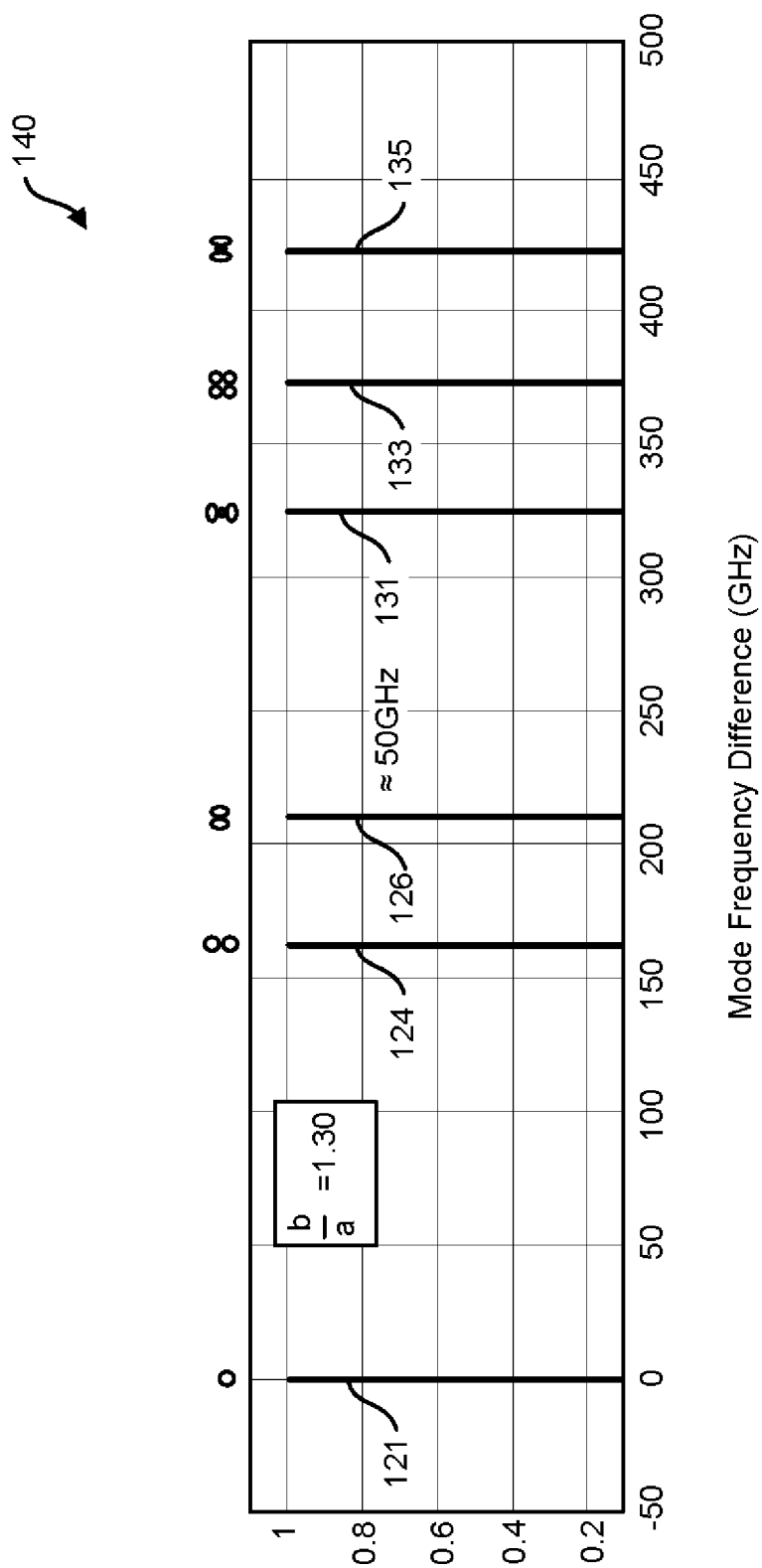
FIG. 7B is a mode frequency graph depicting the optical spectrum of FIG. 7A without complementary polarization light modes.

FIG. 7B is a mode frequency graph 140 depicting the optical spectrum depicted in FIG. 7A without complementary orthogonal polarization light modes. As discussed herein, a selective polarization structure can be employed within a VCSEL device to maximize the emission of light having a particular polarization (e.g., M3B$_x$) whereas minimizing the emission of light which has a polarization that is orthogonal to the maximized light polarization (e.g., M3B$_y$).

Figure 8:
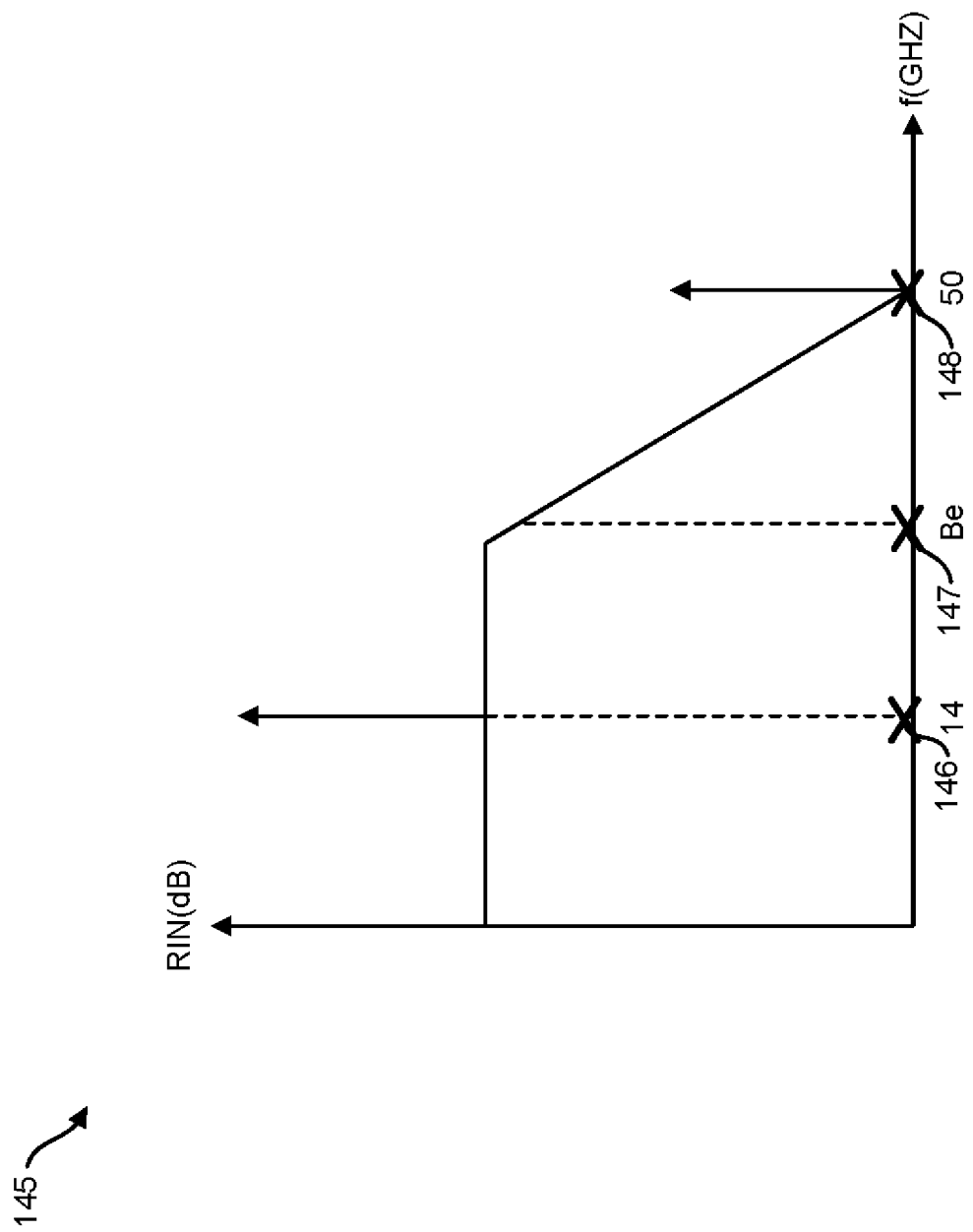
FIG. 8 is a graph depicting an electrical spectrum associated with a VCSEL device which has an oxide aperture region with an ellipticity of 1.07 and a VCSEL device which has an oxide aperture region with an ellipticity of 1.30.

FIG. 8 is a noise-frequency graph 145 depicting an electrical noise spectrum associated with a VCSEL device having an oxide aperture region with a 1.07 ellipticity and a VCSEL device having an oxide aperture region with a 1.30 ellipticity. As shown, the noise-frequency graph 145 depicts the relative intensity noise (RIN) associated with the mode frequency separation of the different VCSEL devices. In one implementation, the degree of optical noise depends on a receiver's detection bandwidth. As such, if the receiver's detection bandwidth is 20 GHz, the beat frequency 147 may be about 20 GHz as well. Notably, the mode frequency separation associated with a VCSEL device with an oxide aperture region having an aspect ratio of about 1.07 is about 14 GHz (i.e., beat frequency 146), which may cause increased deleterious electrical noise in a receiver relative to a VCSEL device with an oxide aperture region having an increased aspect ratio of about 1.30. Increasing the ellipticity of the oxide aperture region to an aspect ratio of about 1.30 can increase the mode frequency separation to about 50 GHz (i.e., beat frequency 148) which can considerably decrease the degree of mode beating noise at the receiver device relative to the lower ellipticity oxide aperture region VCSEL.

It should be understood, however, by one having ordinary skill in the art that if the receiver's bandwidth changes, the degree of degenerate splitting may also be adjusted to account for the change in the receiver's detection bandwidth.

Figure 9:
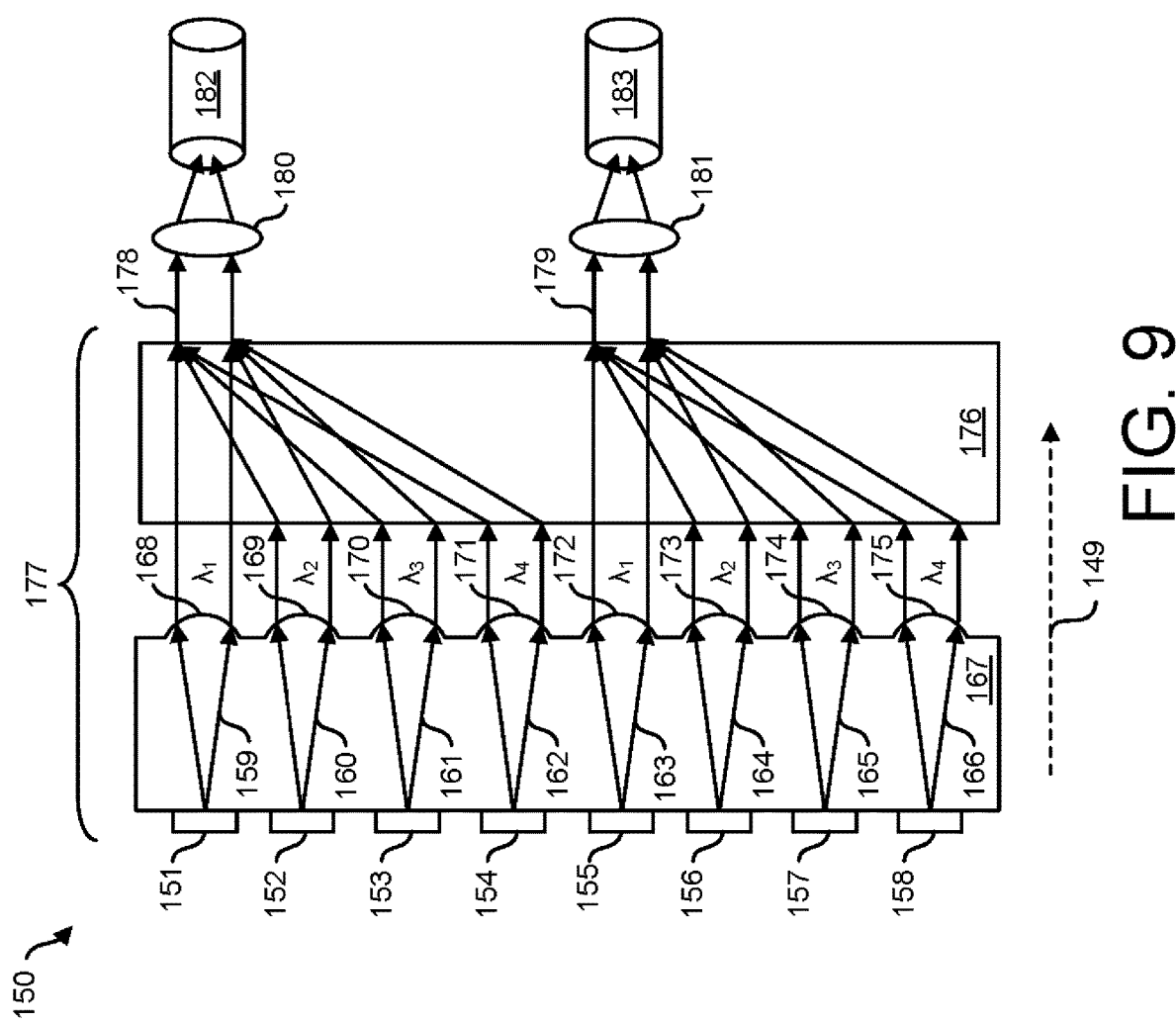
FIG. 9 is a schematic block diagram of a bottom-emitting VCSEL transmission system which implements wave division multiplexing, according to one or more implementations of the present disclosure.

FIG. 9 is a schematic block diagram of a bottom-emitting VCSEL transmission system 150 which implements wavelength division multiplexing using VCSEL terminals 151-158 and wavelength multiplexer 176 device. Notably, each VCSEL terminal 151-158 contains a non-circularly-shaped oxide aperture region (e.g., elliptically-shaped aperture oxide region 101). Although not shown explicitly in FIG. 9, each of the VCSEL terminals 151-158 shown in FIG. 1 may include a VCSEL structure, having a non-circularly-shaped oxide aperture region, disposed on an individual substrate. In addition, each VCSEL terminal 151-158 has a selective polarization structure that maximizes the emission of light (e.g., laser beams) having a first polarization while minimizing the emission of light having a polarization that is orthogonal to the first light from being emitted through the VCSEL terminals 151-158. While illustrated with eight VCSEL terminals, greater or fewer terminals may be employed (e.g., 4, 12, 16, etc.).

The VCSEL transmission system 150 includes a VCSEL transmitter 177, lenses 180, 181, and multi-mode optical fibers 182, 183. However, it should be understood that the present disclosure is not limited to a VCSEL transmission system 150 as depicted in FIG. 9. Notably, VCSEL transmitter 177 includes a collimating surface (e.g., glass) 167 with the plurality of VCSEL terminals 151-158 disposed thereon a frontside.

As shown, the VCSEL terminals 151-158 emit laser beams 159-166 through collimating surface 167 in a direction 149. In some implementations, the emitted laser beams 159-166 may each include a multi-mode array of light. In some implementations, the VCSEL terminals 151-158 are separated from each other by a wavelength spacing between about 15 nm and about 40 nm (e.g., 25 nm).

In addition, the collimating surface 167 incorporates collimating elements 168-175. In some implementations, the collimating elements 168-175 are built-in lens structures which collimate the laser beams 151-158 emitted from the VCSEL terminals 151-158.

The VCSEL transmission system 150 further includes a wavelength multiplexer 176 that changes the direction of the laser beams 160, 161, 162, 164, 165, and 166 based on their wavelengths (e.g., $\lambda_2$, $\lambda_3$, $\lambda_4$). It should be understood by those having ordinary skill in the art that the depicted changes in the direction of the laser beams 160-162 and 164-166 are not necessarily to scale.

In contrast, the wavelength division multiplexer 176 allows the laser beams 159,163 to travel therethrough without changing its direction because laser beams 159, 163 have a different wavelength (e.g., $\lambda_1$). Wavelength division multiplexer 176 multiplexes laser beams 159 with laser beams 160-162 into laser beams 178 and multiplexes laser beam 163 with laser beams 164-166 into laser beams 179. It should be understood by one having ordinary skill in the art that the laser beams 151-158 may each have multiple light modes and may have various wavelengths associated therewith. In one implementation, a reference to a particular wavelength (e.g., $\lambda_1$, $\lambda_2$, $\lambda_3$ or $\lambda_4$) refers to a center wavelength of the laser beams 151-158.

It should be understood by those having ordinary skill in the art that the VCSEL transmitter 177 is not limited to multiplexing only four optical signals. The VCSEL transmitter 177 may multiplex greater than or fewer than four optical signals so long as doing so does not depart from the spirit and scope of the present disclosure. For example, eight laser beams may be multiplexed into a single optical signal and transmitted through an optical fiber.

Lenses 180, 181 focus the laser beams 178, 179 into multi-mode optical fibers 182, 183 which are routed to an external system with a receiver system that converts the optical signals into electrical signals. In some implementations, the laser beam 178 carries four optical signals embedded therein and the laser beam 179 carries four optical signals as well. In some implementations, the VCSEL transmission system 150 may be paired with a receiver system (e.g., as shown in FIG. 10) within a single module to operate as a VCSEL transceiver system, according to one or more implementations of the present disclosure.

The present disclosure implements wavelength-division multiplexing to multiplex a number of optical carrier signals onto a single optical fiber by using different wavelengths of laser light. Advantageously, the VCSEL transmission system 150 employs wavelength division multiplexing to increase the number of signals transmitted through a fiber-optic communications system. In one or more implementations, the present disclosure implements coarse wavelength division multiplexing (CWDM).

Figure 10:
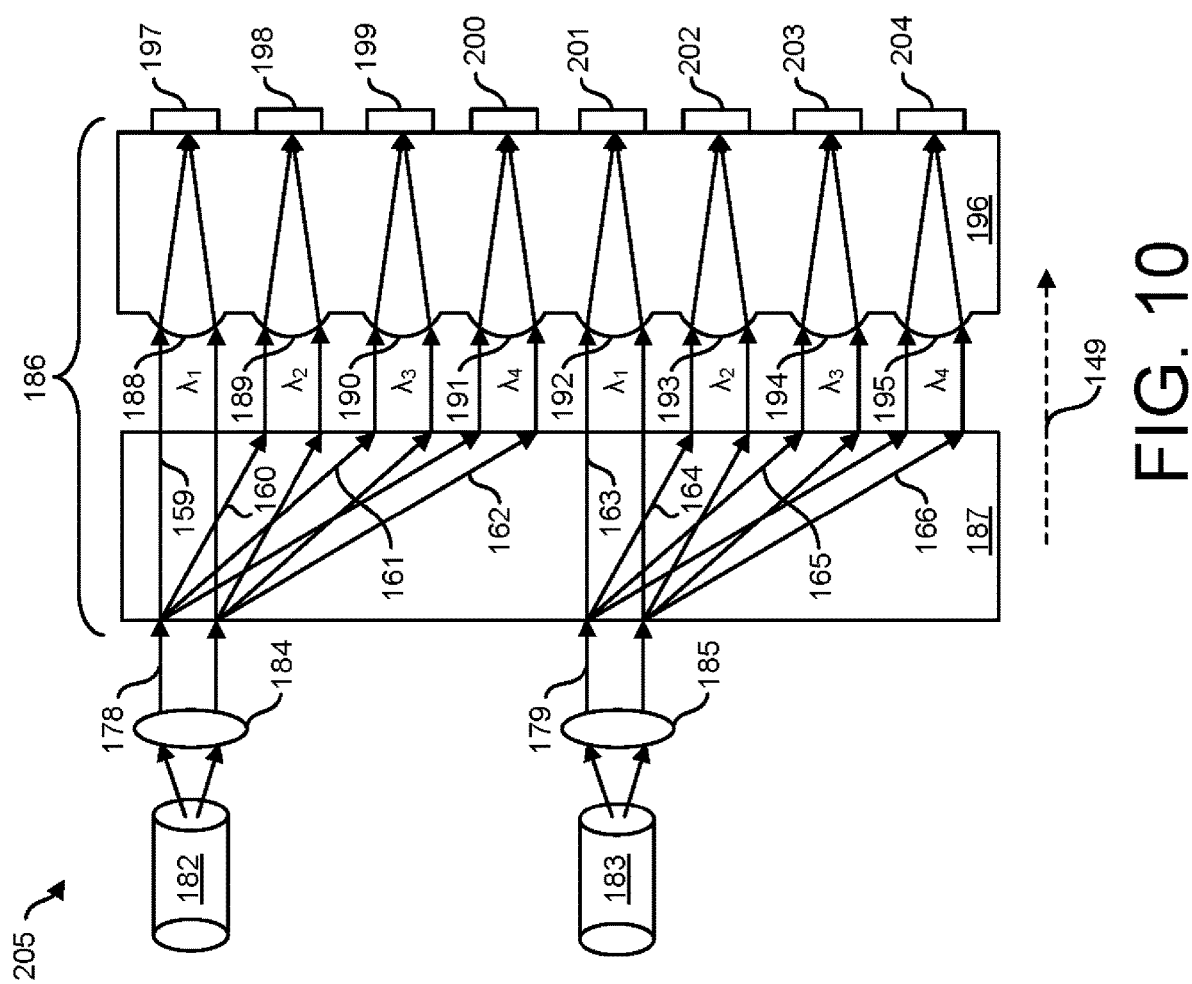
FIG. 10 is a schematic of a receiver system, according to one or more implementations of the present disclosure.

FIG. 10 is a schematic of a receiver system 205, according to one or more implementations of the present disclosure. In the implementation shown, the receiver system 205 can demultiplex a plurality of optical signals (e.g., laser beams 178, 179) within a fiber transmission link. The receiver system 205 includes multi-mode fibers 182, 183, optical lenses 184, 185, demultiplexer 187, and photodetector substrate 196 having photodetectors 197-204 disposed thereon. It should be understood by those having ordinary skill in the art, however, that the present disclosure is not limited to the receiver system 205 as illustrated in FIG. 10.

The receiver system 205 receives the laser beams 178, 179 emitted from a VCSEL transmission system (e.g., VCSEL transmission system 150 shown in FIG. 9) via the multi-mode optical fibers 182, 183, in the implementation shown. The laser beam 178 is directed to a lens 184, which in turns directs the laser beam 178 to a wavelength demultiplexer 187 in the direction 149. Likewise, the laser beam 179 is directed to the optical lens 185 which in turns directs the laser beam 179 to the wavelength demultiplexer 187. The wavelength demultiplexer 187 decouples the optical signals carried by the laser beams 178, 179 into eight optical signals 159-166 according to their wavelengths (e.g., $\lambda_1$, $\lambda_2$, $\lambda_3$, $\lambda_4$, respectively).

The laser beams 159-166 propagate from wavelength demultiplexer 187 to the photodetector substrate 196. The laser beams 159-166 contact and travel through collimating elements 188-195 of the photodetector substrate 196. The laser beams 159-166 propagate through photodetector substrate 196 to photodetector devices 197-204 which convert the optical signals to electrical signals (e.g., current signals).

Notably, the receiver system 205 may be integrated in a module that also hosts any of the VCSEL transmission devices or systems described herein to operate as a VCSEL transceiver system. For example, the receiver system 205 may be paired with the VCSEL transmission system 150 illustrated in FIG. 9 or with the VCSEL transmission system 245 described in reference to FIG. 11 within a single module to operate as a VCSEL transceiver system.

Figure 11:
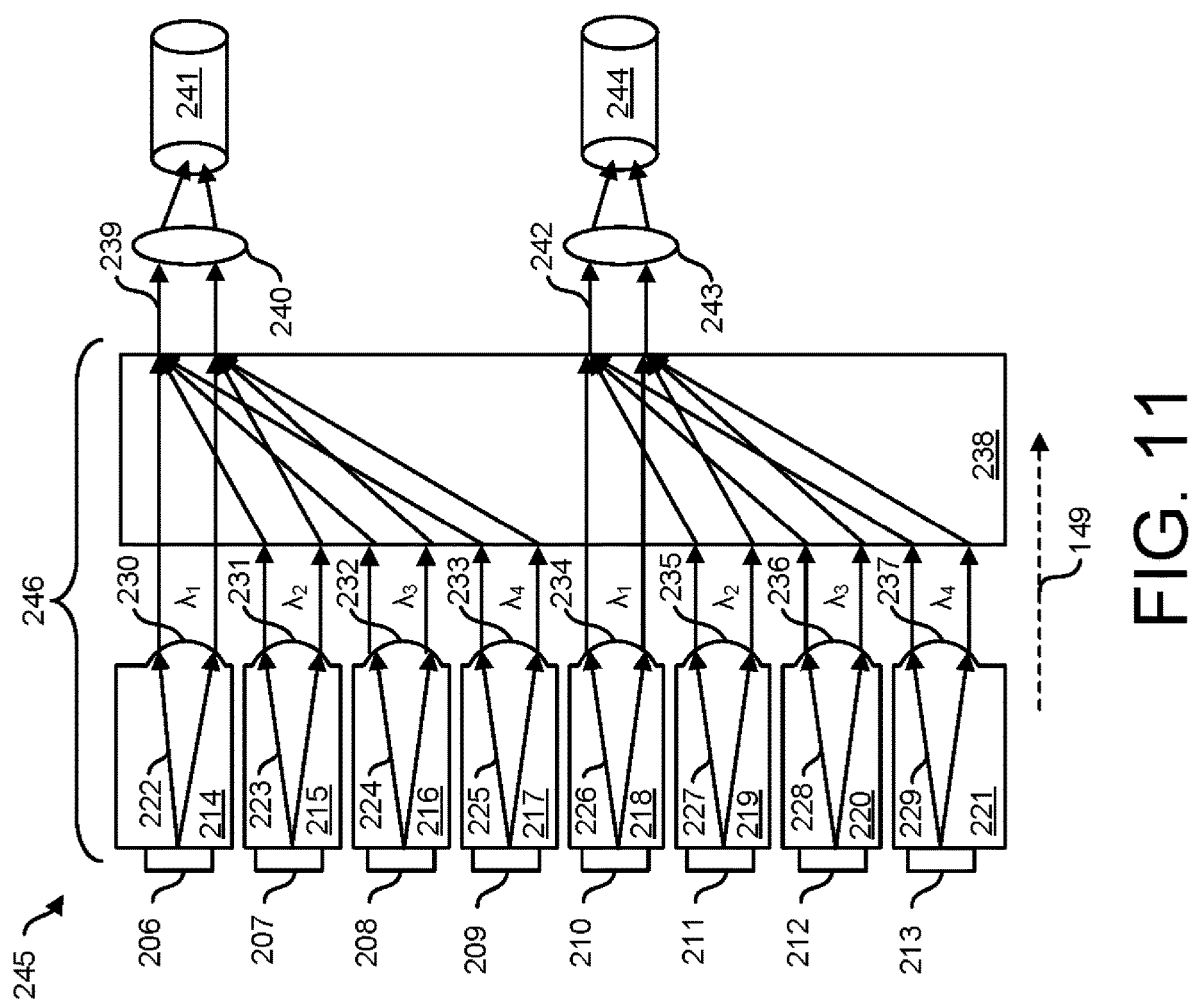
FIG. 11 is yet another schematic block diagram of a bottom-emitting VCSEL transmission system which implements wave division multiplexing, according to one or more implementations of the present disclosure.

FIG. 11 is yet another schematic block diagram of a bottom-emitting VCSEL transmission system 245 which implements wavelength division multiplexing, according to one or more implementations of the present disclosure. Notably, each of the VCSEL terminals 206-213 contains a non-circularly-shaped oxide aperture region (e.g., elliptically-shaped aperture oxide region 101) disposed on individual substrates 214-221. In addition, each of the VCSEL terminals 206-213 has a selective polarization structure that maximizes the emission of light (e.g., laser beams) having a first polarization while minimizing the emission of light having a polarization that is orthogonal to the first light from being emitted through the VCSEL terminals 206-213. While the bottom-emitting VCSEL transmission system 245 is illustrated with eight VCSEL terminals, greater or fewer terminals may be employed (e.g., 4, 12, 16, etc.).

The VCSEL transmission system 245 includes a VCSEL transmitter 246, lenses 240, 243, and multi-mode optical fibers 241, 244. However, it should be understood that the present disclosure is not limited to a VCSEL transmission system 245 as depicted in FIG. 11.

As shown, the VCSEL terminals 206-213 emit laser beams 222-229 through collimating elements 230-237 in direction 149. In some implementations, the collimating elements 230-237 are built-in lens structures which collimate the laser beams 222-229 emitted from the VCSEL terminals 206-213. In some implementations, the emitted laser beams 222-229 may each include a multi-mode array of light. In some implementations, the VCSEL terminals 206-213 are separated from each other by a wavelength spacing between about 15 nm and about 40 nm (e.g., 25 nm).

The VCSEL transmission system 245 further includes a wavelength multiplexer 238 that changes the direction of the laser beams 223-225 and 227-229 based on their wavelengths (e.g., $\lambda_2$, $\lambda_3$, $\lambda_4$). It should be understood by those having ordinary skill in the art that the depicted changes in the direction of the laser beams 223-225 and 227-229 are not necessarily to scale.

In contrast, the wavelength division multiplexer 238 allows the laser beams 222, 226 to travel therethrough without changing its direction because laser beams 222, 226 have a different wavelength (e.g., $\lambda_1$) than the other laser beams. Wavelength division multiplexer 238 multiplexes laser beams 222 with laser beams 223-225 into laser beams 239 and multiplexes laser beam 226 with laser beams 227-229 into laser beams 242. It should be understood by one having ordinary skill in the art that the laser beams 222-229 may each have multiple light modes and may have various wavelengths associated therewith. In one implementation, a reference to a particular wavelength (e.g., $\lambda_1$, $\lambda_2$, $\lambda_3$ or $\lambda_4$) refers to a center wavelength of the laser beams 222-229.

It should be understood by those having ordinary skill in the art that the VCSEL transmitter 246 is not limited to multiplexing only four optical signals. The VCSEL transmitter 246 may multiplex greater than or fewer than four optical signals so long as doing so does not depart from the spirit and scope of the present disclosure. For example, eight laser beams may be multiplexed into a single optical signal and transmitted through an optical fiber.

Lenses 240, 243 focus the laser beams 239, 242 into multi-mode optical fibers 241, 244 which are routed to an external system with a receiver system that converts the optical signals into electrical signals. In some implementations, the laser beam 239 carries four optical signals embedded therein and the laser beam 242 carries four optical signals as well. In some implementations, the VCSEL transmission system 245 may be paired with a receiver system (e.g., as shown in FIG. 10) within a single module to operate as a VCSEL transceiver system, according to one or more implementations of the present disclosure.

The present disclosure implements wavelength-division multiplexing to multiplex a number of optical carrier signals onto a single optical fiber by using different wavelengths of laser light. Advantageously, the VCSEL transmission system 245 employs wavelength division multiplexing to increase the number of signals transmitted through a fiber-optic communications system. In one or more implementations, the present disclosure implements coarse wavelength division multiplexing (CWDM).

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A VCSEL device, comprising:
a substrate;
a first DBR structure disposed on the substrate;
a cathode or anode contact disposed on a top surface of the first DBR structure;
a VCSEL mesa disposed on the top surface of the first DBR structure, the VCSEL mesa having a non-circularly shaped cross-section that has a first major axis and a first minor axis, and comprising:
a quantum well;
a non-circularly-shaped oxide aperture region disposed above the quantum well;
a second DBR structure disposed above the non-circularly-shaped oxide aperture region;
a selective polarization structure disposed above the second DBR structure; and
the other of the cathode contact or the anode contact that is not disposed on the top surface of the first DBR structure being disposed above the selective polarization structure;
wherein the non-circularly-shaped oxide aperture region is configured to increase a mode frequency separation of light modes within one or more mode groups of a multimode signal, and
wherein the non-circularly-shaped oxide aperture region is configured to emit a mode of light having a non-circularly shaped cross-section that has a second major axis and a second minor axis, wherein the second major axis extends non-parallel relative to the first major axis.

2. The VCSEL device of claim 1, wherein the non-circularly-shaped oxide aperture region has a major axis oriented about forty-five degrees relative to a substrate crystal axis of the substrate.

3. The VCSEL device of claim 1, wherein the non-circularly-shaped oxide aperture region is substantially elliptically-shaped.

4. The VCSEL device of claim 3, wherein the elliptically-shaped oxide aperture region has an ellipticity aspect ratio between about 1.05 to about 1.5.

5. The VCSEL device of claim 1, wherein the selective polarization structure maximizes a reflectance of light having a first polarization to emit through the VCSEL mesa and minimizes a reflectance of light having a second polarization from emitting through the VCSEL mesa, the second polarization of light orthogonal to the light having the first polarization.

6. The VCSEL device of claim 1, wherein the light emitted through the VCSEL mesa has light modes within at least one mode group that has a mode frequency separation that is greater than about 20 GHz.

7. The VCSEL device of claim 1, wherein the non-circularly shaped oxide aperture region is asymmetrically-shaped.

8. A VCSEL transmitter device, comprising:
a first VCSEL device disposed on a first substrate;
a second VCSEL device disposed on a second substrate, the second VCSEL device is adjacent to the first VCSEL device, the first VCSEL device and the second VCSEL device each comprising:
a first DBR structure;
a cathode contact disposed on a top surface of the first DBR structure;
a VCSEL mesa disposed on the top surface of the first DBR structure, the VCSEL mesa having a non-circularly shaped cross-section that has a first major axis and a first minor axis, and comprising:
a quantum well;
a non-circularly-shaped oxide aperture region disposed above the quantum well;
a second DBR structure disposed above the non-circularly-shaped oxide aperture region;
a selective polarization structure disposed above the second DBR structure; and
an anode contact disposed above the selective polarization structure; and
a multiplexer to multiplex laser beams emitted from the first VCSEL device and the second VCSEL device;
wherein the non-circularly-shaped oxide aperture region is configured to increase a mode frequency separation of light modes within one or more mode groups of a multimode signal, and
wherein the non-circularly-shaped oxide aperture region is configured to emit a mode of light having a non-circularly shaped cross-section that has a second major axis and a second minor axis, wherein the second major axis extends non-parallel relative to the first major axis.

9. The VCSEL transmitter device of claim 8, wherein the laser beams emitted from the first VCSEL device have a first wavelength and the laser beams emitter from the second VCSEL device have a second wavelength different from the first wavelength.

10. The VCSEL transmitter device of claim 8, wherein the multiplexer is a wavelength multiplexer.

11. The VCSEL transmitter device of claim 8, wherein the laser beams emitted by the first VCSEL device and the second VCSEL device are spaced apart by a wavelength of about twenty nanometers.

12. The VCSEL transmitter device of claim 8, wherein the first VCSEL device and the second VCSEL device are bottom-emitting VCSEL devices.

13. The VCSEL transmitter device of claim 8, wherein the first substrate and the second substrate include gallium arsenide.

14. A VCSEL transmission system, comprising:
a plurality of VCSEL terminals comprising at least a first VCSEL terminal which emits a first light transmission having a first wavelength and a second VCSEL terminal which emits a second light transmission having a second wavelength, each of the plurality of VCSEL terminals comprises:
a substrate;
a first DBR structure on the substrate;
a cathode contact disposed on a top surface of the first DBR structure;
a VCSEL mesa disposed on the top surface of the first DBR structure, the VCSEL mesa having a non-circularly shaped cross-section that has a first major axis and a first minor axis, and comprising:
a quantum well;
a non-circularly shaped oxide aperture region disposed above the quantum well;
a second DBR structure disposed above the non-circularly-shaped oxide aperture region;
a selective polarization structure disposed above the second DBR structure; and
an anode contact disposed over the selective polarization structure; and
a plurality of collimating elements being within an optical path of the plurality of VCSEL terminals, each of the collimating elements of the plurality of collimating elements being aligned with a respective VCSEL terminal;
wherein the non-circularly-shaped oxide aperture region is configured to increase a mode frequency separation of light modes within one or more mode groups of a multimode signal, and
wherein the non-circularly-shaped oxide aperture region is configured to emit a mode of light having a non-circularly shaped cross-section that has a second major axis and a second minor axis, wherein the second major axis extends non-parallel relative to the first major axis.

15. The VCSEL transmission system of claim 14, further comprising:
a wavelength division multiplexer that multiplexes the first light transmissions emitted from the first VCSEL terminals and the second light transmissions emitted from the second VCSEL terminals, and any additional light transmissions emitted from the plurality of VCSEL terminals,
wherein the wavelength division multiplexer directs the multiplexed light transmissions to at least one optical lens; and
at least one optical fiber, the at least one optical fiber being coupled to the at least one lens.

16. The VCSEL transmission system of claim 15, wherein the multiplexed light transmissions comprise at least four multiplexed light transmissions.

17. The VCSEL transmission system of claim 15, wherein the at least one optical fiber simultaneously propagates at least four wavelength division multiplexing signals.

18. The VCSEL transmission system of claim 14, wherein the VCSEL terminal is separated from the second VCSEL terminal by a wavelength spacing between about 15 nm and about 40 nm.

19. The VCSEL transmission system of claim 15, further comprising a receiver device coupled to the at least one optical fiber which receives the first light transmission, the second light transmission, and the additional light transmissions, the receiver device having a detection bandwidth that is less than the mode frequency separation of light modes within a mode group associated with the first light transmissions, the second light transmissions, and the additional light transmissions.

* * * * *